(12) United States Patent  (10) Patent No.: US 9,042,187 B2
Ha  (45) Date of Patent: May 26, 2015

(54) USING A REFERENCE BIT LINE IN A MEMORY

(71) Applicant: Intel Corporation, Santa Clara, CA (US)

(72) Inventor: Chang Wan Ha, San Ramon, CA (US)

(73) Assignee: Intel Corporation, Santa Clara, CA (US)

( * ) Notice: Subject to any disclaimer, the term of this patent is extended or adjusted under 35 U.S.C. 154(b) by 393 days.

(21) Appl. No.: 13/621,435

(22) Filed: Sep. 17, 2012

(65) Prior Publication Data

US 2014/0078836 A1 Mar. 20, 2014

(51) Int. Cl.
*G11C 7/10* (2006.01)
*G11C 7/12* (2006.01)
*G11C 7/22* (2006.01)

(52) U.S. Cl.
CPC . *G11C 7/12* (2013.01); *G11C 7/227* (2013.01)

(58) Field of Classification Search
USPC ............... 365/189.06, 185.25, 203, 210.1
See application file for complete search history.

(56) References Cited

U.S. PATENT DOCUMENTS

| 6,282,114 | B1 | 8/2001 | Hanriat et al. | |
| 2005/0162953 | A1* | 7/2005 | Morikawa | 365/203 |
| 2006/0120174 | A1 | 6/2006 | Chou et al. | |
| 2006/0146625 | A1 | 7/2006 | Morita | |
| 2007/0171744 | A1* | 7/2007 | Mokhlesi et al. | 365/203 |
| 2010/0195376 | A1 | 8/2010 | Yoon et al. | |
| 2010/0195415 | A1 | 8/2010 | Seko | |
| 2011/0063922 | A1* | 3/2011 | Tanaka et al. | 365/185.25 |

FOREIGN PATENT DOCUMENTS

WO 2014/042732 A2 3/2014

OTHER PUBLICATIONS

International Search Report and Written Opinion Received for Patent Application No. PCT/US2013/046291, mailed on Sep. 26, 2013, 10 Pages.
International Preliminary Report on Patentability received for International Application No. PCT/US2013/046291 mailed on Mar. 17, 2015.

* cited by examiner

*Primary Examiner* — Toan Le
(74) *Attorney, Agent, or Firm* — Alpine Technology Law Group LLC (57) ABSTRACT

Methods, memories and systems may include charging a sense node to a logic high voltage level, and supplying charge to a bit line and to a reference bit line for a precharge period that is based, at least in part, on a time for a voltage of the reference bit line to reach a reference voltage. A memory cell that is coupled to the bit line may be selected after the precharge period, and a clamp voltage may be set based, at least in part, on the voltage of the reference bit line. If a voltage level of the bit line is less than the clamp voltage level during a sense period, charge may be drained from the sense node, and a state of the memory cell may be determined based, at least in part, on a voltage level of the sense node near an end of the sense period.

26 Claims, 5 Drawing Sheets

USING A REFERENCE BIT LINE IN A MEMORY

BACKGROUND

1. Technical Field

The present subject matter relates to semiconductor memory, and, more specifically, to controlling an access of a memory.

2. Background Art

Many types of semiconductor memory are known in the art. One type of memory is flash memory which stores charge in a charge storage region of a memory cell. The voltage threshold of the metal-oxide-semiconductor field-effect transistor (MOSFET) based flash cell can be changed by changing the amount of charge stored in the charge storage region of the cell, and the voltage threshold can be used to indicate a value that is stored in the flash cell. By providing a voltage across the flash cell that is between the voltage thresholds of the two different states of the flash cell, the state of the flash cell can be determined by measuring current flowing through the flash cell. A flash cell has a much higher on-current than off-current. One architecture in common use for flash memories is a NAND architecture. In a NAND architecture, two or more memory cells are coupled together into a string, with the individual cell control lines coupled to word lines. A NAND string may be coupled to a bit line at one end of the NAND string.

Another type of memory is phase change memory (PCM). PCMs utilize a phase change material having a non-conductive amorphous state and a conductive crystalline state. A PCM cell may be put into one state or the other to indicate a stored value. By providing a voltage potential across the PCM cell, the state of the PCM cell can be determined by measuring current flowing through the PCM cell. A PCM cell has a much higher on-current than off-current.

Many types of memory, including flash memory and PCM may organize the memory cells into an array with control lines that may cross the array in both the 'X' and 'Y' directions. While these control lines may have many different names, they may commonly be called word lines and bit lines. The control lines may be quite long and have a high resistance and capacitance due to their length and the number of memory cells coupled to the lines.

BRIEF DESCRIPTION OF THE DRAWINGS

The accompanying drawings, which are incorporated in and constitute part of the specification, illustrate various embodiments. Together with the general description, the drawings serve to explain various principles. In the drawings.

DETAILED DESCRIPTION

In the following detailed description, numerous specific details are set forth by way of examples in order to provide a thorough understanding of the relevant teachings. However, it should be apparent to those skilled in the art that the present teachings may be practiced without such details. In other instances, well known methods, procedures and components have been described at a relatively high-level, without detail, in order to avoid unnecessarily obscuring aspects of the present concepts. A number of descriptive terms and phrases are used in describing the various embodiments of this disclosure. These descriptive terms and phrases are used to convey a generally agreed upon meaning to those skilled in the art unless a different definition is given in this specification. Reference now is made in detail to the examples illustrated in the accompanying drawings and discussed below.

Figure 1A:
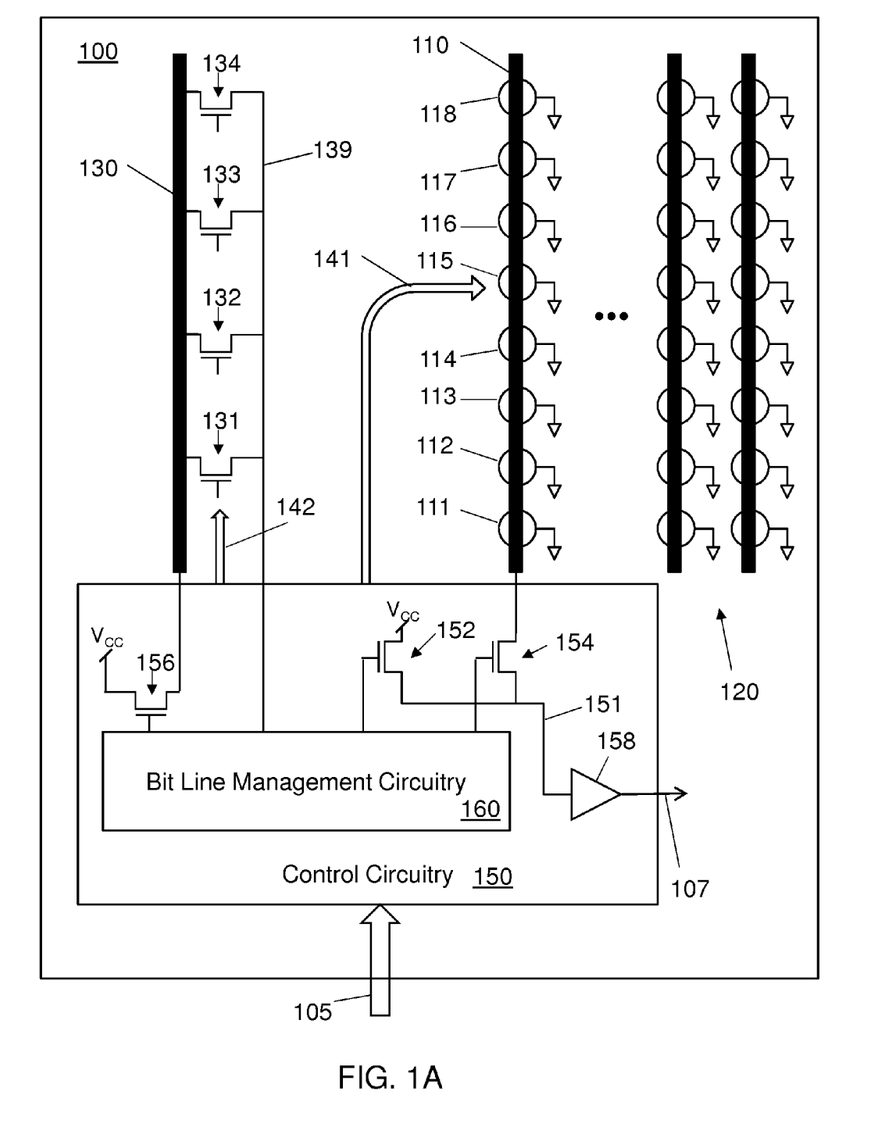
FIG. 1A is a block diagram of an embodiment of a memory.

FIG. 1A is a block diagram of an embodiment of a memory 100. The memory 100 may include various conductors such as the bit line 110 and additional bit lines 120. Although the term "bit line" is generally understood by one skilled in the art other names may be used in some technologies. A bit line, as the term is used herein and in the claims, may refer to any conductor coupled to two or more memory cells that may be used to sense a state of one of the memory cells that is coupled to the line. The bit lines 110, 120 may be a part of a memory array. The bit lines 110, 120 may be respectively coupled to two or more memory cells, such as memory cells 111-118 coupled to the bit line 110. In some embodiments, the memory cells 111-118 may be individually coupled to a bit line 110, but other embodiments may have multiple memory cells arranged as strings in a NAND architecture with the strings coupled to a bit line at one end of the string. The memory cells 111-118 may be distributed along the bit line 110 so that some memory cells 111-118 are closer to a sense node 151 than others. In the example shown, memory cell 111 is closest to the sense node 151 and the memory cell 118 is farthest from the sense node 151. The memory cells 111-118 may be also be coupled to ground and may have a conductive state and a non-conductive state so that an electrical charge on the bit line 110 may be drained to ground through a memory cell if a memory cell is in the conductive state. If the memory cells are arranged into NAND strings, one end of the NAND string may be coupled to ground where the string is conductive if all the memory cells of the string are conductive. Additional memory control lines, such as word lines 141, may be provided to select a memory cell from the memory cells 111-118 coupled to a bit line 110.

A reference bit line 130 may be included. The reference bit line 130 may have substantially similar electrical characteristics to the other bit lines 110, 120. In some embodiments, the length of the reference bit line 130 may be substantially the same as the other bit lines. In some embodiments, the length, resistance, and capacitance of the reference bit line 130 may be, respectively, within about 10% of the length, resistance, and capacitance of at least one of the bit lines, such as bit line 110. While the resistance and capacitance of the bit line 110 may vary widely between various embodiments, in some embodiments, the overall resistance of the bit line 110 may be between about 1 megaohm (MΩ) and about 5 MΩ and the lumped capacitance of the bit line 110 may be between about 1 picofarad (pF) and about 2 pF. The length of the bit line 110 may also vary widely between embodiments, but in at least some embodiments, the length of the bit line 110 may be between about 1 millimeter (mm) and about 3 mm long. The bit line 110 and the reference bit line 130 may act as transmission lines so that the electrical waveform may vary depending on where the voltage is measured along the bit line 110 or reference bit line 130.

The reference bit line 130 may be included in the memory array in some embodiments but other embodiments may include the reference bit line 130 outside of the memory array area. The reference bit line 130 may, or may not, have memory cells coupled to it, but may include structures to simulate the capacitance of memory cells. In some embodiments, the reference bit line 130 may be coupled to usable memory cells that are not accessed simultaneously to the memory cells 111-118 that are coupled to the bit line 110. The reference bit line 130 may include two or more taps to provide different voltage detection locations distributed along the reference bit line 130. Any number of taps may be provided in various embodiments, although embodiments may provide fewer taps on the reference bit line 130 than the number of memory cells coupled to a bit line 110. In some embodiments, a small number of taps, such as 256 taps or fewer, may be provided even if thousands of memory cells may be coupled to the bit line 110. In at least one embodiment, as few as four taps may be provided on the reference bit line 130, with other embodiments providing 8, 16, or 32 taps. The taps may be coupled by pass transistors 131-134 to a voltage monitoring line 139 which is coupled to control circuitry 150. The control gates of the pass transistors 131-134 may be driven by tap selection lines 142 to allow the control circuitry 150 to selectively turn on one of the pass transistors 131-134 to select a tap.

The memory 100 may also include control circuitry 150. The control circuitry 150 may include a sense node 151 that may be coupled to the bit line 110 by a pass transistor 154, which may be referred to as a clamping transistor in some embodiments. In some embodiments, a multiplexer may be used to allow one of several bit lines to be coupled to the pass transistor 154. A sense gate, such as the buffer 158 may be coupled to the sense node 151 to detect a state of the addressed memory cell based on a voltage level of the bit line 110 as will be described in more detail below. The output 107 of the buffer 158 may provide the state of the addressed memory cell or may provide the inversion of the state, depending on the embodiment.

The control circuitry 150 may receive address and/or command lines 105 that may be coupled to an external source accessing the memory 100. The control circuitry 150 may respond to certain commands, such as read commands, write commands, erase commands, and/or program commands, received on the lines 105. In some embodiments, control circuitry may provide the state of an addressed memory cell as indicated by the output 107 of the buffer 158 in response to a read command and/or may validate the state of the addressed memory cell in response to a write, program, or erase command.

A pass transistor 152, which may be referred to as a charging transistor in some embodiments, may couple the sense node to a charge source, such as a supply voltage $V_{CC}$. A pass transistor 156 may be included to couple the reference bit line 130 to charge source, such as a supply voltage $V_{CC}$. The control gates of the pass transistors 152, 154, 156 may be driven from bit line management circuitry 160, an embodiment of which is shown in more detail in FIG. 1B. The bit line management circuitry 160 may initiate at least three different periods in response to a memory command, a precharge period, a development period, and a sense period, which may be described in more detail below. In some embodiments, multiple bits of the memory 100 may be accessed simultaneously with multiple bit lines used. In such embodiments, individual sense nodes 151, buffers 158, and pass transistors 152, 154 may be provided for the respective bit lines.

Figure 1B:
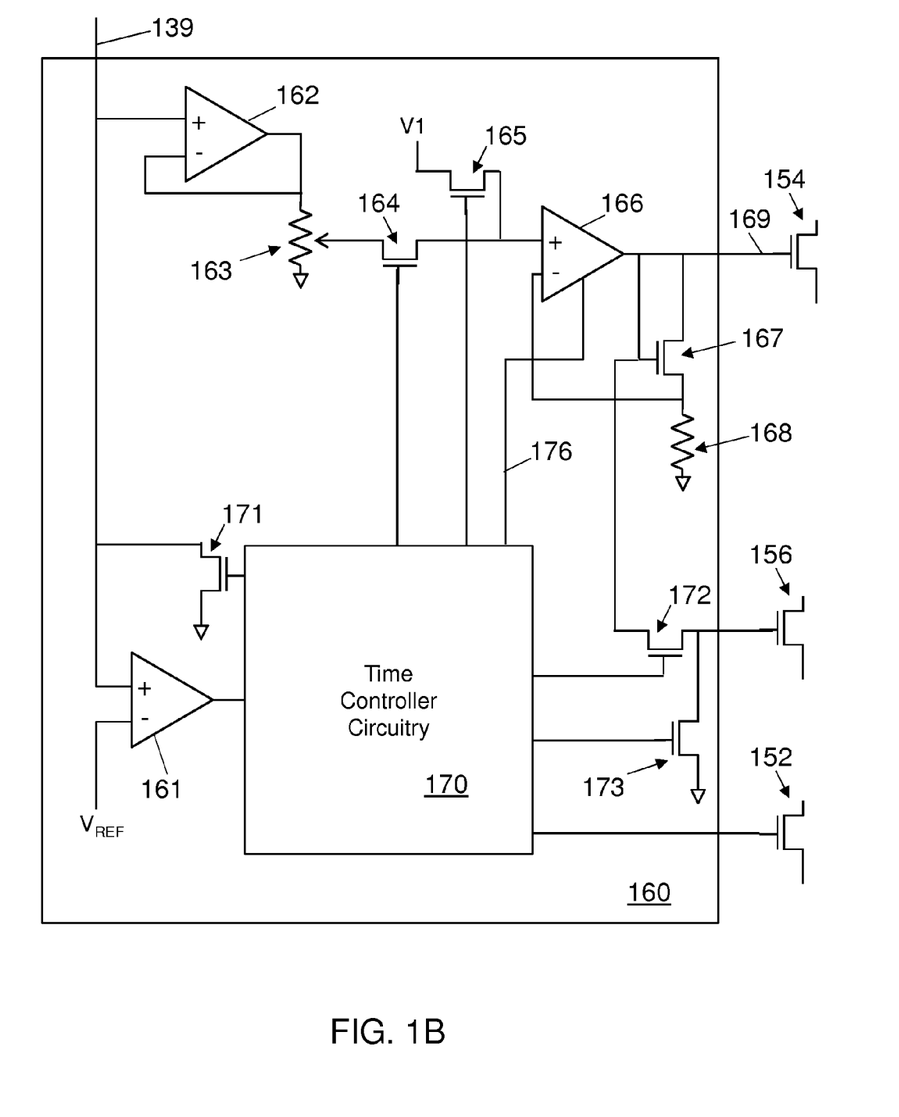
FIG. 1B is a block diagram of an embodiment of control circuitry for a memory.

FIG. 1B is a block diagram of an embodiment of control circuitry, including the bit line management circuitry 160 for a memory 100. In response to a memory command, the bit line management circuitry 160 may start a precharge period.

During the precharge period, the memory cells 111-118 of a selected bit line 110 may be deselected and in a non-conducting state. In some embodiments, the memory cells 111-118 may be deselected by deasserting the word lines 141 respectively coupled to the memory cells 111-118 although other embodiments may provide alternative mechanisms to put the memory cells 111-118 in the non-conducting state. At the beginning of the precharge period, the reference bit line 130 may be in an uncharged state with a voltage of about 0 volts (V) throughout its length. A tap may be selected by asserting one of the tap selection lines 142. The tap may be selected based, at least in part, on an address of the memory cell that is addressed. The address may be mapped to the tap based, at least in part, on a distance from the addressed memory cell to the sense node 151. So if the memory cell 111 is the addressed memory location, which is close to the sense node 151, the first tap may be selected by driving the control gate of the pass transistor 131 high. If the memory cell 118 is the addressed memory location, which is far from the sense node 151, the last tap may be selected by driving the control gate of the pass transistor 134 high. Selecting a tap couples the voltage monitoring line 139 to a specific point of the reference bit line 130.

During the precharge period the time controller circuitry 170 may charge the sense node 151 to a logic high level by enabling pass transistor 152 to couple a supply voltage $V_{CC}$, to the sense node 151. The voltage level of the supply voltage $V_{CC}$ may vary according to the embodiment, but may be greater than the various voltages provided to the control gates of the pass transistor 154 and pass transistor 156, and may be about 3 V in some embodiments. During the precharge period the time controller circuitry 170 may also enable pass transistor 165 to pass voltage V1 to the non-inverting input of the op-amp 166 while disabling the pass transistor 164. The pass transistor 164 and pass transistor 165 may be used to implement a two to one mux by enabling one, and not the other, pass transistor. The time controller circuitry 170 may enable the op-amp 166 using enable line 176. The op-amp 166 may function as an op-amp if the enable line 176 is high, but may drive its output to about ground if the enable line 176 is low. A transistor 167 is included with both its source and control gate coupled to the output of the op-amp 166, and its drain coupled to the inverting input of the op-amp 166 and resistor 168 to provide for a current flow through the transistor 167. In some embodiments circuitry may be provided to reduce power by eliminating the current through the resistor 168 during idle period, such as a pass transistor controlled by the enable line 176. The arrangement shown may provide a charge voltage on the clamp line 169 that is about equal to the voltage V1 plus the voltage threshold $V_t$ of the transistor 167, which may be representative of other transistors in the circuit. The clamp line 169 may be coupled to the control gate of the pass transistor 154 that couples the bit line 110 to the sense node 151. This arrangement may supply charge from $V_{CC}$ through the pass transistor 152 to the sense node 151 and from the sense node 151 through the pass transistor 154 to the bit line 110 during the precharge period.

The time controller 170 may supply charge to the reference bit line 130 by enabling the pass transistor 172 to couple the clamp line 169 to the pass transistor 156, which may allow charge from the supply voltage $V_{CC}$ to flow to the reference bit line 130. The voltage of the reference bit line 130 may be monitored at the selected tap through the voltage monitoring line 139. The comparator 161 may compare the voltage monitoring line 139 to a reference voltage $V_{REF}$ and indicate if the voltage monitoring line 139 has reached the reference voltage $V_{REF}$. In some embodiments the reference voltage $V_{REF}$ may be varied according to the address of the memory cell being accessed, or the distance from the addressed memory cell to the sense node 151. In at least one embodiment, the reference voltage $V_{REF}$ may be lower for memory cells that are farther from the sense node 151. Once the voltage of the reference bit line 130 at the selected tap has reached the reference voltage $V_{REF}$, the time controller circuitry may end the precharge period.

The time controller circuitry 170 may take several actions at the end of the precharge period. The time controller circuitry may disable the op-amp 166 by deasserting the enable line 176 to drive the clamp line 169 low and stop supplying charge to the bit line 110. Thus, the time that charge is supplied to the bit line 110, which may be referred to as the precharge period, may be based on a time for a voltage of the reference bit line 130 to reach a reference voltage $V_{REF}$. The time controller circuitry 170 may also turn on the pulldown transistor 173 and turn off the pass transistor 172 to turn off the pass transistor 156 and stop supplying charge to the reference bit line 130. The time controller circuitry 170 may also turn off the pass transistor 152 to stop charging the sense node 151, although other embodiments may delay turning off the pass transistor 152 until a later time.

Because the reference bit line 130 may have substantially the same electrical properties as the bit line 110, the voltage of the bit line 110 may be substantially similar to the voltage of the reference bit line 130 during the precharge period. So the voltage of the bit line 110 may not exceed the reference voltage $V_{REF}$ by very much, even if the clamp line 169 is at a significantly higher voltage than the reference voltage $V_{REF}$. If a higher charge voltage is provided on the clamp line 169 the precharge period, the bit line 110 and the reference bit line 130 may charge faster due to the higher differential between the control gate and drain of the pass transistors 154, 156 and the resistance-capacitance (RC) charging effects. So the charge voltage may be higher than the reference voltage $V_{REF}$. In some embodiments the charge voltage may at least 200 millivolts (mV) higher than the reference voltage $V_{REF}$. In some embodiments the reference voltage may be in a range of about 300 mV to about 600 mV, and the charge voltage may be in a range of about 500 mV to about 1.0 V.

After the precharge period has ended, the addressed memory cell coupled to the bit line 110 may be selected. By selecting the memory cell, the memory cell may be conductive if in a first state, such as an erased state or '0' state, and be non-conductive if in the other state, such as set state of a '1' state. In some embodiments, a single memory cell may have more than 2 states to allow multiple bits of information to be stored in a single memory cell, but as long as the state of the cell is detectable by a current flowing through the cell, the memory call may be deemed to be selected. In some embodiments the memory cell may be selected by asserting a word line coupled to the memory cell. In embodiments using a NAND architecture, the non-addressed cells of the NAND string may made to conduct, regardless of their state, and the addressed cell selected. Once the addressed memory cell has been selected, the time controller circuitry 170 may provide a development period for the charge that was stored on the bit line 110 to stabilize and to allow the selected cell to drain the charge if the addressed cell is conductive. It may take some time for the bit line 110 to stabilize after the end of the precharge period due to transmission line effects in the bit line 110 and/or to allow time for the charge to distribute throughout the bit line 110.

Because of length of the reference bit line 130 with the capacitance and resistance distributed through the length, the voltage of the reference bit line 130 at the selected tap may change after the end of the precharge period, even though no more charge may be supplied. Because the charge may be supplied to one end of the reference bit line 130, there may more charge, and therefore a higher voltage, at that end of the reference bit line 130 than at the opposite end. So during the development period, the charge may distribute through the reference bit line 130. If the near tap was chosen by enabling pass transistor 131 to compare to the reference voltage V, the voltage at that tap may be lower than the reference voltage $V_{REF}$ after the development period. If the far tap was chosen by enabling pass transistor 134, the voltage at that tap may be higher than the reference voltage $V_{REF}$ after the development period.

After the development period, the time controller circuitry 170 may initiate a sense period. At the beginning of the sense period, the pass transistor 152 may be turned off to decouple the sense node 151 from the supply voltage $V_{CC}$, if it was not turned off earlier. The pass transistor 156 may be left off to allow the reference bit line 130 to continue to float at its stabilized voltage level, and a clamp voltage may be set based, at least in part, on the voltage of the reference bit line 130. The voltage monitoring line 139 may be coupled to the non-inverting input of an op-amp 162 configured as a unity gain amplifier. A voltage divider 163 may be provided to allow a margin voltage to be selected in some embodiments. The voltage divider 163 may be a fixed voltage divider, a resistive ladder with multiple selectable taps that may be fixed during the packaging and test phase or selected during operation, a fixed voltage drop set by a diode or transistor and a resistor to ground or a supply voltage, or any other circuit to allow a margin voltage to be subtracted from the voltage of the reference bit line 139. In at least one embodiment, the margin voltage may be variable in a range from about 50 mV to about 200 mV. The two-to-one mux may be controlled to pass the output of the voltage divider 163 by turning on pass transistor 164 and turning off pass transistor 165 so that a clamp voltage about equal to the voltage of the reference bit line 130 minus the margin voltage is provided to the non-inverting input of the op-amp 166. The op-amp 166 may be enabled during the sense period by asserting the enable line 176 so that a control voltage equal to the clamp voltage plus a threshold voltage $V_t$ is provided on the clamp line 169 to the control gate of the pass transistor 154 during the sense period.

With the clamp line 169 at a voltage level equal to the clamp voltage plus a threshold voltage $V_t$, the pass transistor 154 may conduct if at least one of the other terminals is less than the clamp voltage. So if the selected memory cell is in a non-conductive state, the bit line 110 is at a voltage about equal to the voltage of the reference bit line 130, and the sense node is at a supply voltage $V_{CC}$. Because the clamp voltage is lower than the voltage of the reference bit line 130 by the margin voltage, and the voltage of the reference bit line 130 is lower than the supply voltage $V_{CC}$ which was used to charge it, the pass transistor 154 may not conduct in the sense period. If the pass transistor 154 does not conduct, the charge at the sense node 151 may not be drained and the voltage of the sense node 151 may remain at a logic high level during the sense period. If the selected memory cell is in a conductive state, the bit line 110 may have been discharged through the selected memory cell during the development period, so the bit line 110 may be at a voltage lower than the reference voltage $V_{REF}$ and may be near 0 V. With the bit line 110 at a voltage lower than the clamp voltage, charge from the sense node 151 may drain to the bit line 110 during the sense period, and because the capacitance of the bit line 110 is much greater than the capacitance of the sense node 151, and the selected memory cell may continue to drain charge from the bit line 110 to ground, the voltage of the sense node 151 may be close to the voltage of the bit line 110, which may be near 0 V and may be detected as a logic low level during the sense period. So the state of the addressed memory cell may be determined based on a voltage level of the bit line 110. In some embodiments, a logic low level on the sense line may correspond to an erased '0' state with a logic high level corresponding to a set '1' state, but other embodiments may reverse the correspondence and yet others may use multiple voltage levels to represent multiple bits. After the sense period is over, the reference bit line may be discharged to about 0 volts by turning on transistor 171. In some embodiments, multiple pass transistors 131-134 may be turned on while transistor 171 is on to help speed the return of the reference bit line 130 to about 0 V through its entire length.

It may be noted that only one embodiment of the control circuitry 150 is described herein, but that one of ordinary skill may take the description of the desired behavior and design many other embodiments of circuitry to perform the same behaviors. Depending on the circuit technologies used, different circuit topologies may be more or less efficient than the circuitry shown in FIGS. 1A and 1B.

Figure 2A:
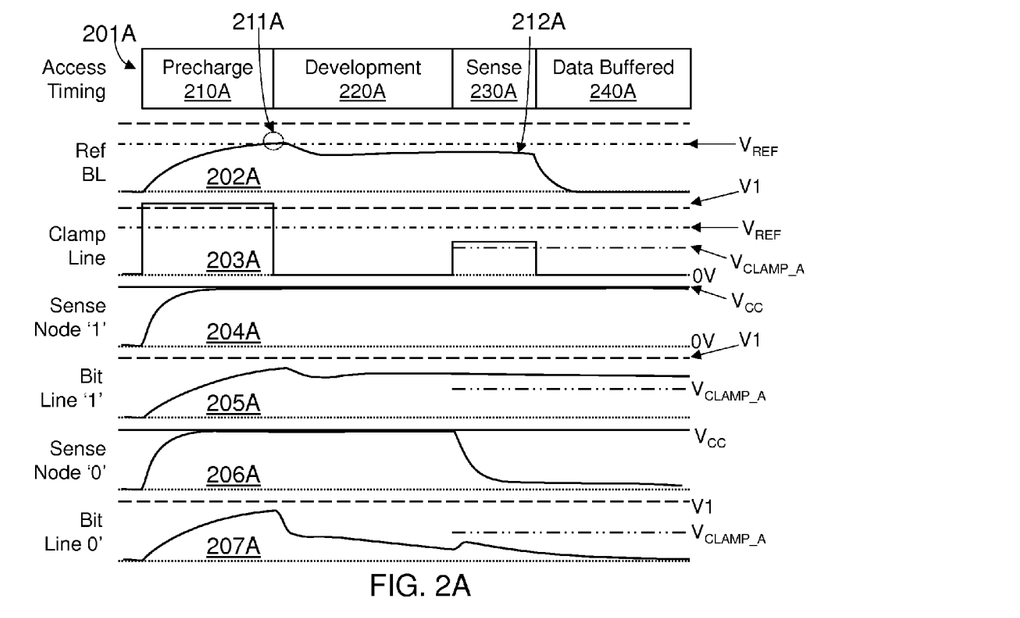
FIGS. 2A and 2B are timing diagrams of various lines in an embodiment of a memory.
Figure 2B:
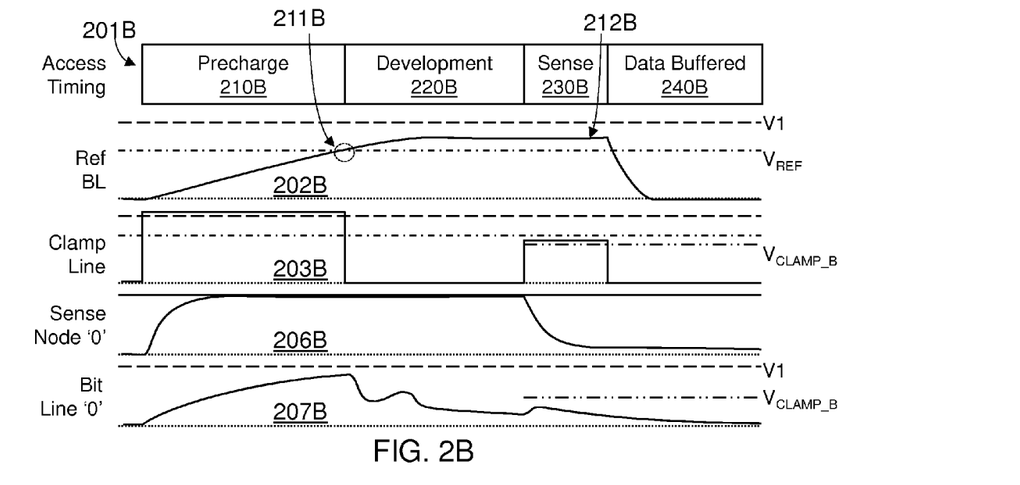

FIGS. 2A and 2B are timing diagrams of various lines in an embodiment of a memory 100 such as that shown in FIGS. 1A and 1B. FIG. 2A shows accesses of a memory cell that is close to the sense node 151, such as memory cell 111, and FIG. 2B shows an access of a memory cell that is far from the sense node 151, such as the memory cell 118.

Referring now to FIG. 2A, the access timing indicator 201A shows four different periods that may make up an access of the memory 100. The precharge period 210A may be characterized as the time where the bit line 110 and reference bit line 130 are charged. The development period 220A may be characterized as the time where a memory cell is selected and the bit line 110 may stabilize to a voltage that is dependent on the state of the selected memory cell. The sense period 230A may be characterized as a time where the sense node 151 may represent the state of the selected memory cell, and the data buffered period 240A may be characterized as the period where the data read from the memory may be latched, returned to as read data, verified, or otherwise used.

The voltage waveform 202A of the reference bit line 130 shows an access of memory cell 111 that is close to the sense node 151. Because the memory cell 111 is close to the sense node 151, the first tap off the reference bit line 130 may be selected by enabling the pass transistor 131 and disabling the other pass transistors 132-134 on the other taps. Two different accesses are shown in FIG. 2A. One access, shown by waveforms 204A and 205A, is with the selected memory cell 111 in a non-conductive '1' state, and the other access, shown by waveforms 206A and 207A, is with the selected memory cell 111 in a conductive '0' state, with waveforms 202A and 203A applying to both accesses.

The pass transistor 152 may be turned on during the precharge period 210A, so that the sense node 151, as shown by the sense node '1' waveform 204A and the sense node '0' waveform 206A, rises to a level close to the supply voltage $V_{CC}$. The clamp line waveform 203A shows the voltage at the control gate of the pass transistor 154 that is coupled to the bit line 110. The control gate of the pass transistor 156 may also be driven with a similar voltage during the precharge period 210A. The clamp waveform 203A shows a voltage slightly higher than the voltage V1 during the precharge period 210A. Charge may be supplied to the bit line 110 and the reference bit line 130 through the pass transistor 154 and pass transistor 156 respectively during the precharge period 210A as shown by the waveform 202A and waveforms 205A and 207A.

Once the reference bit line 130 reaches the reference voltage $V_{REF}$ at point 211A, the precharge period 210A may be ended by driving the clamp line, as well as the control gates of pass transistor 152 and pass transistor 156, to ground as shown in waveform 203A. During the development period 220A that follows, the voltage of reference bit line 130 may stabilize as shown by waveform 202A. Because the selected tap is close to the start of the reference bit line 130, the stabilized voltage of the reference bit line 130 may be somewhat lower than the reference voltage $V_{REF}$ as the charge distributes throughout the reference bit line 130.

The addressed memory cell(s) may be selected during the development period 220A. Two examples are shown with the waveform 204A showing the sense node 151 and the waveform 205A showing the bit line 110 for a selected memory cell 111 in the non-conductive '1' state. The waveform 206A shows the sense node 151 and the waveform 207A shows the bit line 110 for a selected memory cell 111 in the conductive '0' state. The waveform 204A and waveform 206A both show the sense node 151 holding its charge during the development period 220A, as the pass transistor 154 is off. The waveform 205A shows that the bit line 110 may stabilize at a similar voltage to the reference bit line 130 if the selected memory cell 111 is non-conductive. The waveform 207A shows that the bit line 110 may be pulled down during the development period 220A if the selected memory cell 111 is conductive, and may be a low voltage near ground by the end of the development period 220A.

So during the sense period 230, a clamp voltage $V_{CLAMP\_A}$ may be set based, at least in part, on the voltage 212A of the reference bit line 130 as described above. The clamp voltage $V_{CLAMP\_A}$ may be lower than the voltage 212A of the reference bit line 130 by a margin voltage that may be determined by the voltage divider 163. The clamp line 169 may be coupled to the gate of the pass transistor 154 the couples the sense node 151 to the bit line 110, so if both the sense node 151 as shown in waveform 204A and the bit line 110 as shown in waveform 205A are higher than the clamp voltage $V_{CLAMP\_A}$, the pass transistor 154 may remain non-conductive and the sense node 151 may remain at the logic high level, which may be detected by the buffer 158 to indicate that the selected memory cell 111 is in the non-conductive '1' state. But if the bit line 110 is lower than the clamp voltage $V_{CLAMP\_A}$, as shown by waveform 207A, the pass transistor 154 may conduct and allow the sense node 151 to be pulled to a logic low level, which may be detected by the buffer 158 to indicate that the selected memory cell 111 is in the conductive '0' state. While charge may be shared between the sense node 151 and the bit line 110, the final voltage level of the two nodes may stabilize at essentially the voltage level of the bit line 110 because the bit line 110 may have a much higher capacitance than the sense node in most embodiments and the selected memory cell 111 may be actively pulling the two nodes low.

Some embodiments may include a data buffered period 240A after the data of the selected memory cell 111 has been detected and buffered or otherwise used. During the data buffered period 240A the reference bit line 130 may be pulled low by the transistor 171 so that the reference bit line 130 is discharged and ready for a new access after the data buffered period 240A. Some embodiments, however, may set the value of the clamp voltage $V_{CLAMP\_A}$ based, at least in part, on the voltage of reference bit line 130 at the beginning of the sense period and hold that clamp voltage $V_{CLAMP\_A}$ during the sense period 230A while turning on the transistor 171 to discharge the reference bit line during the sense period 230A.

In such embodiments, the data buffered period 240A may be much shorter or even eliminated.

FIG. 2B shows waveforms for an access of a memory cell that is farther from the sense node 151 than the access shown in FIG. 2B, such as memory cell 118. Because the memory cell 118 is far from the sense node 151, a tap of the reference bit line 130 that is far from pass transistor 156, such as pass transistor 134 may be selected by driving the respective tap selection line 142 high. So during the precharge period 210B shown in the access timing indicator 201B, the clamp line 169 is driven to a voltage level a bit higher than voltage V1, as shown by waveform 203B, along with enabling pass transistor 152 and pass transistor 156, similarly to the precharge period 210A shown in FIG. 2A. But because the selected tap pass transistor 134 is farther from the pass transistor 156 supplying charge to the reference bit line 130, the waveform 202B may rise more slowly than if a closer tap was selected. Therefore, it may take a longer time for the reference bit line 130 to reach the reference voltage $V_{REF}$ at point 211B causing the precharge period 210B to be longer than the precharge period 210A. The sense node 151, however, may charge at approximately the same rate, as shown by waveforms 206A and 206B.

During the development period 220B, the reference bit line 130 may stabilize at a higher voltage than the reference voltage $V_{REF}$ due to transmission line effects and/or the time it may take for the charge to distribute along the reference bit line 130 to get to the far end. In the access shown in FIG. 2B, the selected memory cell 118 may be in the conductive '0' state so the waveform 207B may show the bit line 110 pulled low by the selected memory cell 118 during the development period 220B. During the sense period 230B, the clamp voltage $V_{CLAMP\_B}$ may be set based, at least in part, on the voltage 212B of the reference bit line 130. If the reference voltage $V_{REF}$ is the same in FIG. 2B as in FIG. 2A, the voltage 212B of the reference bit line 130 may be higher than the voltage 212A, so the clamp voltage $V_{CLAMP\_B}$ for the access of the memory cell 118 that is far from the sense node 151 may be higher than the clamp voltage $V_{CLAMP\_A}$ for the access of the memory cell 111 that is close to the sense node 151. In some embodiments, the reference voltage $V_{REF}$ may be varied dependent on the distance of the selected memory cell from the sense node 151. In one embodiment, the reference voltage $V_{REF}$ may be set to a lower voltage if the addressed memory cell if farther from the sense node 151 so that the stabilized voltage of the reference bit line 130 may be approximately the same voltage, independent of the distance of the addressed memory cell to the sense node 151.

During the sense period 230B a voltage a bit higher than the clamp voltage $V_{CLAMP\_B}$ may be applied to the clamp line 169 as shown in waveform 203B. Because the bit line 110 is at a voltage lower than the clamp voltage $V_{CLAMP\_B}$, as shown by waveform 207B, the pass transistor 154 may conduct, allowing the sense node 151 to be discharged into the bit line 110. This may cause the sense node 151 to be at a logic low level, so the buffer 158 may detect the state of the selected memory cell 118 to be a '0' based on the voltage level of the sense node 151. The reference bit line 202B may be pulled low during the data buffered period 240B so that the memory 100 is ready for the next access.

Figure 3:
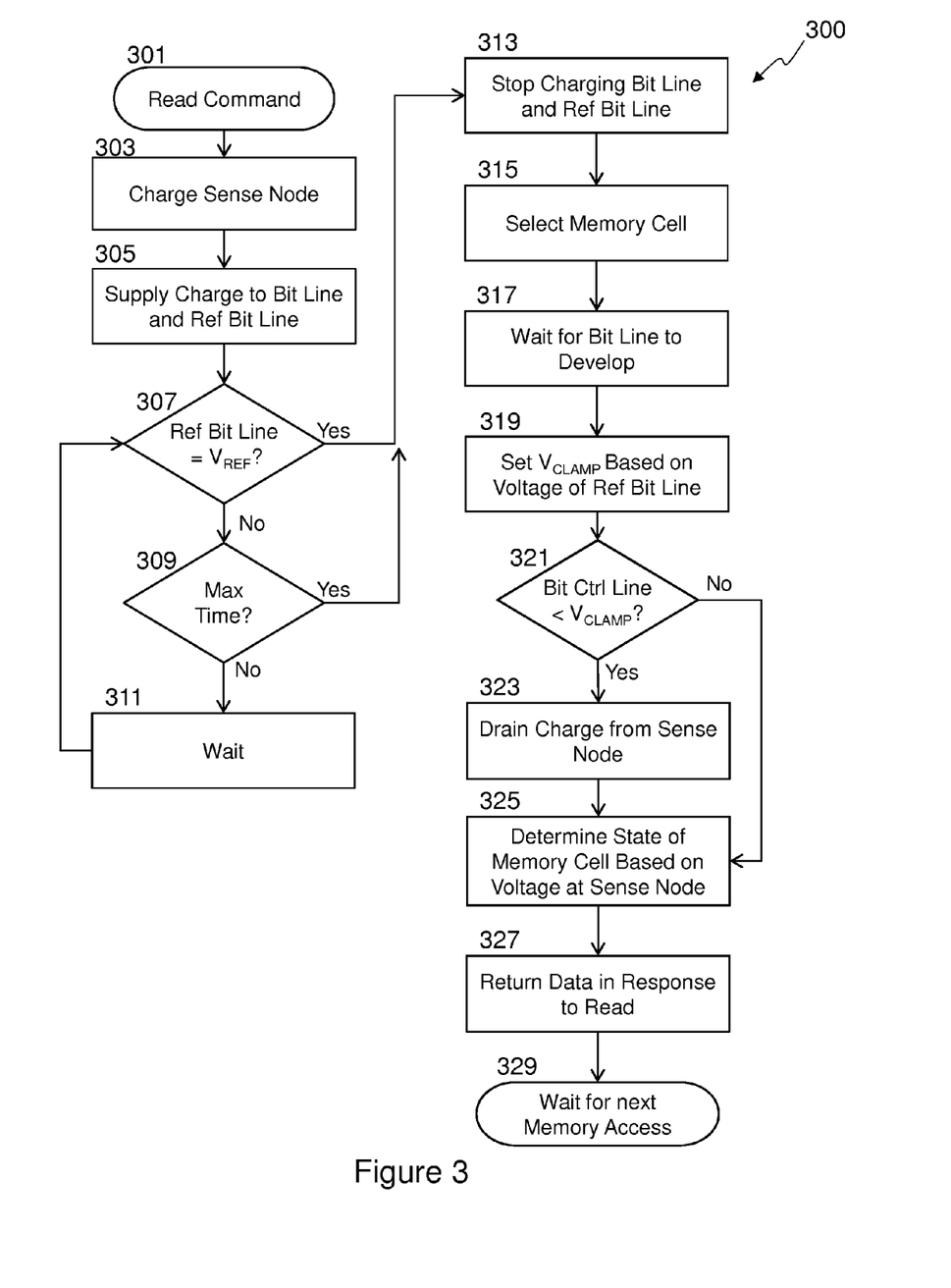
FIG. 3 is a flow chart of an embodiment of a method for accessing memory.

FIG. 3 is a flow chart 300 of an embodiment of a method for accessing memory. A read command may be received a block 301. In some embodiments, the method may be also used to verify data after a write, program, or erase command. The sense node may be charged to a logic high voltage level at block 303 and charge supplied to a bit line and to a reference bit line at block 305. At block 307 the reference bit line may be compared to a reference voltage and if the reference bit line has reached the reference voltage, the flow chart 300 may continue with block 313 which ends the precharge period, so the precharge period may be based on a time for a voltage of the reference bit line to reach a reference voltage. The reference bit line may have several taps and the voltage of the reference bit line may be detected at a tap off the reference bit line in some embodiments. A specific tap may be selected based on an address of the selected memory cell and/or a distance of the selected memory cell from the sense node.

If the reference bit line has not yet reached the reference voltage, the time spent charging the reference bit line may be compared to a maximum time at block 309, and if the maximum time limit has been reached, the flow chart may continue on to block 313, so the precharge period may end after a predetermined time if the reference bit line does not charge to the reference voltage. In some embodiments, the fact that the maximum time has been reached may be used to extend the other periods of the access, such as extending the development period and/or the sense period. If the maximum time has not been reached, some more time may pass at block 311 and then the reference bit line voltage may be compared to the reference voltage again at block 307, although some embodiments may continuously compare the reference bit line voltage to the reference voltage. In some embodiments the reference voltage may be determined based, at least in part, on an address of the selected memory cell. The address may identify a specific physical memory cell, so the determination may be based on a distance from the selected memory cell to a sense node. In some embodiments the reference voltage may be adjusted lower if a distance from the selected memory cell to the sense node is larger.

During the precharge period, the charge may be supplied, in part, by providing a charge voltage that is greater than the reference voltage. In at least one embodiment, the charge voltage may be provided to the control gate of a pass transistor coupling the bit line to a supply voltage. The relative voltage levels may vary, but in at least one embodiment, the charge voltage may be at least about 200 mV greater than the reference voltage. In some embodiments the charge voltage may be even higher, such as in an embodiment where the reference voltage may be in a range of about 300 mV to about 600 mV, and the charge voltage may be in a range of about 500 mV to about 1.0 V.

At the end of the precharge period, the charging of the bit line and the reference bit line may be stopped at block 313 and the addressed cell coupled to the bit line may be selected after the precharge period at block 315. During a development period, the bit line may be provided time to develop and stabilize at block 317 based on the state of the selected memory cell. A sense period may follow the development period where the clamp voltage may be set based, at least in part, on the voltage of the reference bit line at block 319, which may be detected through the selected tap. In some embodiments the clamp voltage may be reduced by a margin voltage so that the clamp voltage is based, at least in part, on the voltage of the reference bit line minus a margin voltage. The margin voltage may be selectable and may vary between embodiments, but in at least one embodiment, the margin voltage may be variable in a range from about 50 mV to about 200 mV.

At block 321 the voltage of the bit line may be checked against the clamp voltage during the sense period, and if the voltage of the bit line is less than the clamp voltage, charge may be drained from the sense node at block 323. The state of the memory cell may be determined at block 325 based on a voltage level of the sense node near an end of the sense period.

In at least one embodiment, if the voltage level is a logic high level, the state of the memory cell may be determined to be a logic '1', and if the voltage level is a logic low level, the state of the memory cell may be determined to be a logic '0'. At block 327 the state of the memory cell may be returned in response to a read command. In some embodiments, the state of the memory cell may be used to validate the state of the memory cell in response to a write, program or erase command. The flow chart 300 may wait for the next memory access at block 329.

Figure 4:
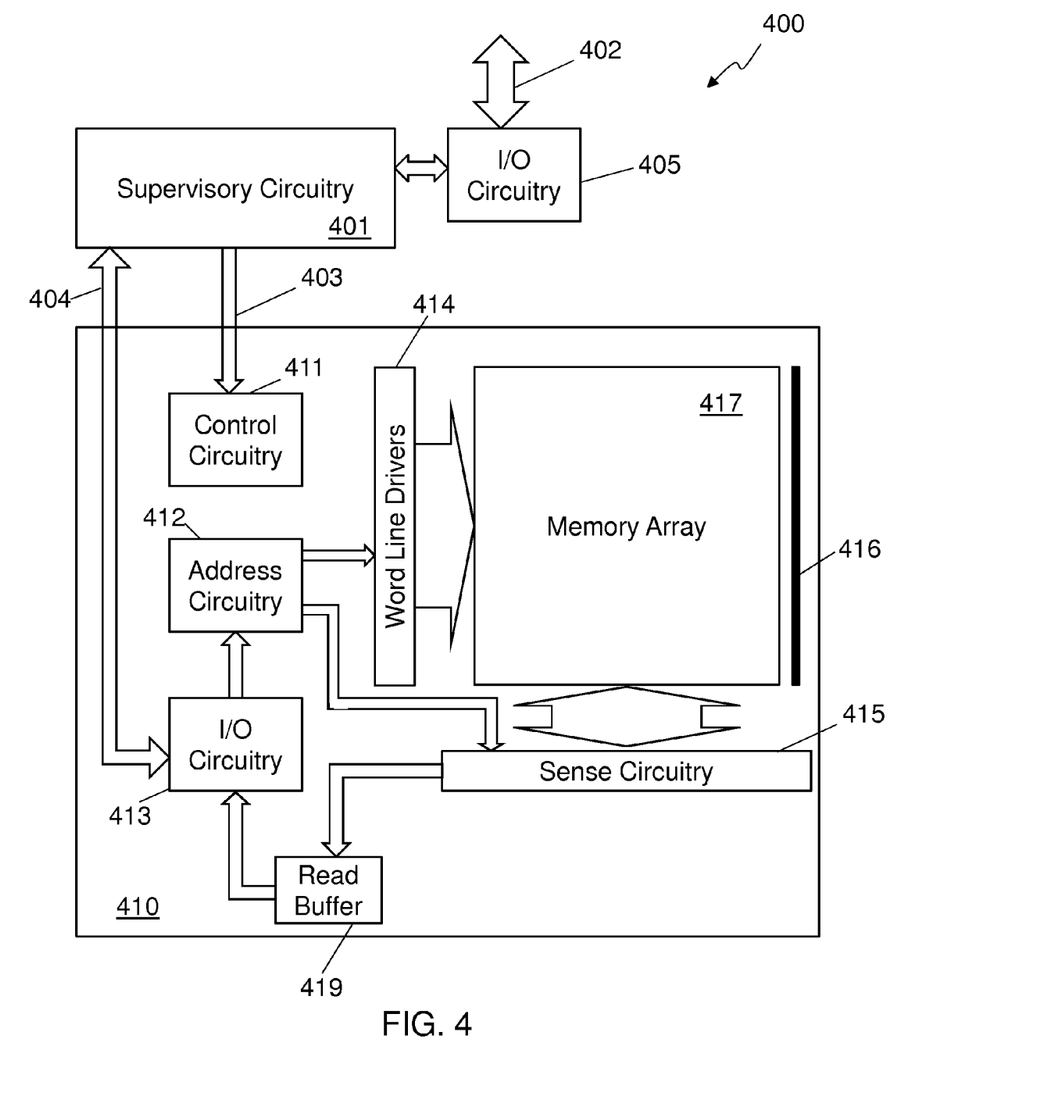
FIG. 4 is a block diagram of an embodiment of an electronic system.

FIG. 4 is a block diagram of an embodiment of an electronic system 400 with memory 410 that includes a reference bit line 416. Supervisory circuitry 401 is coupled to the memory device 410 with control/address lines 403 and data lines 404. In some embodiments, data and control may utilize the same lines. The supervisory circuitry 401 may be a processor, microprocessor, microcontroller, finite state machine, or some other type of controlling circuitry. The supervisory circuitry 401 may execute instructions of a program in some embodiments. In some embodiments, the supervisory circuitry 401 may be integrated in the same package or even on the same die as the memory device 410. In some embodiments, the supervisory circuitry 401 may be integrated with the control circuitry 411, allowing some of the same circuitry to be used for both functions. The supervisory circuitry 401 may have external memory, such as random access memory (RAM) and read only memory (ROM), used for program storage and intermediate data or it may have internal RAM or ROM. In some embodiments, the supervisory circuitry 401 may use the memory device 410 for program or data storage. A program running on the supervisory circuitry 401 may implement many different functions including, but not limited to, an operating system, a file system, memory block remapping, and error management.

In some embodiments an external connection 402 is provided. The external connection 402 is coupled to input/output (I/O) circuitry 405 which may then be coupled to the supervisory circuitry 401 and allows the supervisory circuitry 401 to communicate to external devices. In some embodiments, the I/O circuitry 405 may be integrated with the supervisory circuitry 401 so that the external connection 402 is directly coupled to the supervisory circuitry 401. If the electronic system 400 is a storage system, the external connection 402 may be used to provide an external device with non-volatile storage. The electronic system 400 may be a solid-state drive (SSD), a USB thumb drive, a secure digital card (SD Card), or any other type of storage system. The external connection 402 may be used to connect to a computer or other intelligent device such as a cell phone or digital camera using a standard or proprietary communication protocol. Examples of computer communication protocols that the external connection 402 may be compatible with include, but are not limited to, any version of the following protocols: Universal Serial Bus (USB), Serial Advanced Technology Attachment (SATA), Small Computer System Interconnect (SCSI), Fibre Channel, Parallel Advanced Technology Attachment (PATA), Integrated Drive Electronics (IDE), Ethernet, IEEE-1394, Secure Digital Card interface (SD Card), Compact Flash interface, Memory Stick interface, Peripheral Component Interconnect (PCI) or PCI Express (PCI-e).

If the electronic system 400 is a computing system, such as a mobile telephone, a tablet, a notebook computer, a set-top box, or some other type of computing system, the external connection 402 may be a network connection such as, but not limited to, any version of the following protocols: Institute of Electrical and Electronic Engineers (IEEE) 802.3, IEEE 802.11, Data Over Cable Service Interface Specification (DOCSIS), digital television standards such as Digital Video Broadcasting (DVB)—Terrestrial, DVB-Cable, and Advanced Television Committee Standard (ATSC), and mobile telephone communication protocols such as Global System for Mobile Communication (GSM), protocols based on code division multiple access (CDMA) such as CDMA2000, and Long Term Evolution (LTE).

The memory device 410 may include an array 417 of memory cells. The memory cells may be organized into using any architecture and may use any type of memory technology. The memory array 417 may include various lines, such as bit lines and/or word lines. The bit lines may be coupled to two or more memory cells of the memory array 417 respectively. A reference bit line 416, which may be coupled to the control circuitry, may be included and used as described above. Address lines and control lines 403 may be received and decoded by control circuitry 411, I/O circuitry 413 and address circuitry 412 which may provide control to the memory array 417 through the word line drivers 414 and/or the sense circuitry 415. I/O circuitry 413 may couple to the data lines 404 allowing data to be received from and sent to the supervisory circuitry 401. Data read from the memory array 417 may be temporarily stored in read buffers 419.

The system illustrated in FIG. 4 has been simplified to facilitate a basic understanding of the features of the system. Many different embodiments are possible including using a single supervisory circuitry 401 to control a plurality of memory devices 410 to provide for more storage space. Additional functions, such as a video graphics controller driving a display, and other devices for human oriented I/O may be included in some embodiments.

The flowchart and/or block diagrams in the figures help to illustrate the architecture, functionality, and operation of possible implementations of systems, methods and computer program products of various embodiments. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Examples of various embodiments are described in the following paragraphs:

An example method to access a memory may include charging a sense node to a logic high voltage level, and supplying charge to a bit line and to a reference bit line for a precharge period that is based, at least in part, on a time for a voltage of the reference bit line to reach a reference voltage. The example method may continue with selecting a memory cell coupled to the bit line after the precharge period, setting a clamp voltage based, at least in part, on the voltage of the reference bit line, draining charge from the sense node if a voltage level of the bit line is less than the clamp voltage level during a sense period, and determining a state of the memory cell based, at least in part, on a voltage level of the sense node near an end of the sense period. In some example methods the clamp voltage level is reduced by a margin voltage. In some example methods the margin voltage is variable in a range from about 50 mV to about 200 mV. In some example methods the supplying of the charge includes providing a charge voltage that is greater than the reference voltage. In some example methods the charge voltage is at least about 200 mV greater than the reference voltage. Some example methods may also include adjusting the reference voltage lower if a distance from the selected memory cell to the sense node is larger. Some example methods may also include determining the reference voltage based, at least in part, on an address of the selected memory cell. Some example methods may also include selecting a tap off the reference bit line based, at least in part, on a distance of the selected memory cell from the sense node, and detecting the voltage of the reference bit line through the selected tap. Some example methods may also include selecting a tap off the reference bit line based, at least in part, on an address of the selected memory cell, and detecting the voltage of the reference bit line through the selected tap. Some example methods may also include ending the precharge period after a predetermined time if the reference bit line does not charge to the reference voltage. Some example methods may also include providing the state of the memory cell in response to a read command. Some example methods may also validating the state of the memory cell in response to a program or erase command. Any combination of the examples of this paragraph may be used in embodiments.

An example memory may include bit lines respectively coupled to two or more memory cells, a reference bit line, and control circuitry comprising a sense node. The control circuitry may be arranged to supply charge to a bit line and to the reference bit line for a precharge period that is based, at least in part, on a time for a voltage of the reference bit line to reach a reference voltage, charge the sense node to a logic high level, select a memory cell coupled to the bit line after the precharge period, set a clamp voltage based, at least in part, on the voltage of the reference bit line, drain charge from the sense node if a voltage level of the bit line is less than a clamp voltage level during a sense period, and detect a state of the memory cell based, at least in part, on a voltage level of the bit line. In some example memories the reference bit line includes two or more taps to provide different voltage detection locations off the reference bit line. In some example memories the control circuitry is further arranged to select a tap based, at least in part, on a distance of the selected memory cell from the sense node. In some example memories the control circuitry is further arranged to select a tap based, at least in part, on an address of the selected memory cell. In some example memories the reference bit line has a length, resistance, and capacitance that are, respectively, within about 10% of a length, resistance, and capacitance of the bit line. In some example memories the control circuitry may also include a pass transistor coupled between the bit line and the sense node. In some example memories the control circuitry may also couple a supply voltage to the sense node and apply a charge voltage to a control gate of the pass transistor to supply the charge to the bit line through the pass transistor during the precharge period, and apply a control voltage to the control gate of the pass transistor to drain the charge drain sense node during the sense period. during the sense period. In some example memories the control voltage is higher than the clamp voltage by about a voltage threshold of the pass transistor, the charge voltage is greater than the reference voltage, and the supply voltage is greater than the charge voltage. In some example memories the charge voltage is at least about 200 mV greater than the reference voltage. In some example memories the clamp voltage level is reduced by a margin voltage. In some example memories the margin voltage is variable in a range from about 50 mV to about 200 mV. In some example memories the control circuitry is further arranged to adjust the reference voltage lower if a distance from the selected memory cell to the sense node is larger. In some example memories the control circuitry is further arranged to determine the reference voltage based, at least in part, on an address of the selected memory cell. In some example memories the memory cell is selected with a word line. In some example memories the control circuitry is further arranged to end the pre charge period after a predetermined time if the reference bit line does not reach the reference voltage. In some example memories the control circuitry is further arranged to provide the state of the memory cell in response to a read command and to validate the state of the memory cell in response to a program or erase command. Any combination of the examples of this paragraph may be used in embodiments.

An example electronic system may include supervisory circuitry to generate a memory access, and at least one memory, coupled to the supervisory circuitry. The memory may be described by any combination of the examples of the previous paragraph, or may include a memory array comprising a bit line coupled to two or more memory cells, a reference bit line, and control circuitry comprising a sense node. In the example electronic system, the control circuitry may be arranged to enable charge to flow into the bit line and the reference bit line, monitor a voltage level of the reference bit line, stop charge from flowing into the bit line and the reference line if the voltage of the reference bit line to reaches a reference voltage, charge the sense node to a logic high level, select a memory cell coupled to the bit line after the charge has stopped flowing into the bit line, drain charge from the sense node if a voltage level of the bit line is less than the voltage of the reference line by at least a margin voltage, and detect a state of the memory cell based, at least in part, on a voltage level of the sense node. In some example electronic systems, the reference bit line may include two or more taps to provide different voltage monitor locations off the reference bit line, and the control circuitry may be further arranged to select a tap based, at least in part, on an address of the selected memory cell. In some example electronic systems, the control circuitry further may also include a pass transistor coupled between the bit line and the sense node, and the control circuitry may be further arranged to couple a supply voltage to the sense node and apply a charge voltage to a control gate of the pass transistor to enable charge to flow into the bit line through the pass transistor, and apply a control voltage to the control gate of the pass transistor to drain charge from the sense node. In some example electronic systems, the control voltage may be based, at least in part, on the voltage of the reference bit line, the charge voltage may be greater than the reference voltage, and the supply voltage may be greater than the charge voltage. In some example electronic systems, the margin voltage may be in a range from about 50 mV to about 200 mV. In some example electronic systems, the control circuitry may be further arranged to determine the reference voltage based, at least in part, on an address of the selected memory cell. Some example electronic systems may also include I/O circuitry, coupled to the supervisory circuitry, to communicate with an external device. Some example electronic systems may be a solid state drive. Any combination of the examples of this paragraph and the preceding paragraph may be used in embodiments.

Unless otherwise indicated, all numbers expressing quantities of elements, optical characteristic properties, and so forth used in the specification and claims are to be understood as being modified in all instances by the term "about." The recitation of numerical ranges by endpoints includes all numbers subsumed within that range including the endpoints.

As used in this specification and the appended claims, the singular forms "a", "an", and "the" include plural referents unless the content clearly dictates otherwise. Furthermore, as used in this specification and the appended claims, the term "or" is generally employed in its sense including "and/or" unless the content clearly dictates otherwise. As used herein, the term "coupled" includes direct and indirect connections. Moreover, where first and second devices are coupled, intervening devices including active devices may be located there between.

The description of the various embodiments provided above is illustrative in nature and is not intended to limit this disclosure, its application, or uses. Thus, different variations beyond those described herein are intended to be within the scope of embodiments. Such variations are not to be regarded as a departure from the intended scope of this disclosure. As such, the breadth and scope of the present disclosure should not be limited by the above-described exemplary embodiments, but should be defined only in accordance with the following claims and equivalents thereof.

What is claimed is:

1. A method to access a memory, the method comprising:
charging a sense node to a logic high voltage level;
supplying charge to a bit line and to a reference bit line for a precharge period that is based, at least in part, on a time for a voltage of the reference bit line to reach a reference voltage;
selecting a memory cell coupled to the bit line after the precharge period;
setting a clamp voltage based, at least in part, on the voltage of the reference bit line;
draining charge from the sense node if a voltage level of the bit line is less than the clamp voltage level during a sense period; and
determining a state of the memory cell based, at least in part, on a voltage level of the sense node near an end of the sense period.

2. The method of claim 1, wherein the clamp voltage level is reduced by a margin voltage.

3. The method of claim 1, wherein the supplying of the charge comprises providing a charge voltage, wherein the charge voltage is greater than the reference voltage.

4. The method of claim 3, wherein the charge voltage is at least about 200 mV greater than the reference voltage.

5. The method of claim 1, further comprising adjusting the reference voltage lower if a distance from the selected memory cell to the sense node is larger.

6. The method of claim 1, further comprising:
selecting a tap off the reference bit line based, at least in part, on a distance of the selected memory cell from the sense node; and
detecting the voltage of the reference bit line through the selected tap.

7. The method of claim 1, further comprising:
ending the precharge period after a predetermined time if the reference bit line does not charge to the reference voltage.

8. The method of claim 1, further comprising:
providing the state of the memory cell in response to a read command.

9. The method of claim 1, further comprising:
validating the state of the memory cell in response to a program or erase command.

10. A memory comprising:
bit lines respectively coupled to two or more memory cells;
a reference bit line; and
control circuitry comprising a sense node;
wherein the control circuitry is arranged to:
supply charge to a bit line and to the reference bit line for a precharge period that is based, at least in part, on a time for a voltage of the reference bit line to reach a reference voltage;
charge the sense node to a logic high level;
select a memory cell coupled to the bit line after the precharge period;
set a clamp voltage based, at least in part, on the voltage of the reference bit line;
drain charge from the sense node if a voltage level of the bit line is less than a clamp voltage level during a sense period; and
detect a state of the memory cell based, at least in part, on a voltage level of the bit line.

11. The memory of claim 10, wherein the reference bit line comprises two or more taps to provide different voltage detection locations off the reference bit line, and wherein the control circuitry is further arranged to select a tap based, at least in part, on an address of the selected memory cell.

12. The memory of claim 10, wherein the reference bit line has a length, resistance, and capacitance that are, respectively, within about 10% of a length, resistance, and capacitance of the bit line.

13. The memory of claim 10, wherein the control circuitry further comprises a pass transistor coupled between the bit line and the sense node; and
wherein the control circuitry is further arranged to:
during the precharge period, couple a supply voltage to the sense node and apply a charge voltage to a control gate of the pass transistor to supply the charge to the bit line through the pass transistor; and
during the sense period, apply a control voltage to the control gate of the pass transistor to drain the charge drain sense node;
wherein the control voltage is higher than the clamp voltage by about a voltage threshold of the pass transistor, the charge voltage is greater than the reference voltage, and the supply voltage is greater than the charge voltage.

14. The memory of claim 13, wherein the charge voltage is at least about 200 mV greater than the reference voltage.

15. The memory of claim 10, wherein the clamp voltage level is reduced by a margin voltage.

16. The memory of claim 14, wherein the margin voltage is variable in a range from about 50 mV to about 200 mV.

17. The memory of claim 10, wherein the control circuitry is further arranged to determine the reference voltage based, at least in part, on an address of the selected memory cell.

18. The memory of claim 10, wherein the memory cell is selected with a word line.

19. The memory of claim 10, wherein the control circuitry is further arranged to provide the state of the memory cell in response to a read command and to validate the state of the memory cell in response to a program or erase command.

20. An electronic system comprising:
supervisory circuitry to generate a memory access; and
at least one memory coupled to the supervisory circuitry, the at least one memory comprising:
a memory array comprising a bit line coupled to two or more memory cells;
a reference bit line; and
control circuitry comprising a sense node;

wherein the control circuitry is arranged to:
enable charge to flow into the bit line and the reference bit line;
monitor a voltage level of the reference bit line;
stop charge from flowing into the bit line and the reference line if the voltage of the reference bit line to reaches a reference voltage;
charge the sense node to a logic high level;
select a memory cell coupled to the bit line after the charge has stopped flowing into the bit line;
drain charge from the sense node if a voltage level of the bit line is less than the voltage of the reference line by at least a margin voltage; and
detect a state of the memory cell based, at least in part, on a voltage level of the sense node.

21. The electronic system of claim 20, further comprising; I/O circuitry, coupled to the supervisory circuitry, to communicate with an external device.

22. The electronic system of claim 20, wherein the electronic system comprises a solid state drive.

23. The electronic system of claim 20, wherein the reference bit line comprises two or more taps to provide different voltage monitor locations off the reference bit line, and wherein the control circuitry is further arranged to select a tap based, at least in part, on an address of the selected memory cell.

24. The electronic system of claim 20, wherein the control circuitry further comprises a pass transistor coupled between the bit line and the sense node; and
wherein the control circuitry is further arranged to:
couple a supply voltage to the sense node and apply a charge voltage to a control gate of the pass transistor to enable charge to flow into the bit line through the pass transistor; and
apply a control voltage to the control gate of the pass transistor to drain charge from the sense node;
wherein the control voltage is based, at least in part, on the voltage of the reference bit line, the charge voltage is greater than the reference voltage, and the supply voltage is greater than the charge voltage.

25. The electronic system of claim 20, wherein the margin voltage is in a range from about 50 mV to about 200 mV.

26. The electronic system of claim 20, wherein the control circuitry is further arranged to determine the reference voltage based, at least in part, on an address of the selected memory cell.

* * * * *